(12) United States Patent
Miyamoto et al.

(10) Patent No.: US 8,536,698 B2
(45) Date of Patent: Sep. 17, 2013

(54) SEMICONDUCTOR DEVICE

(75) Inventors: Noboru Miyamoto, Tokyo (JP); Shouji Saito, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 213 days.

(21) Appl. No.: 13/027,648

(22) Filed: Feb. 15, 2011

(65) Prior Publication Data

US 2011/0304037 A1 Dec. 15, 2011

(30) Foreign Application Priority Data

Jun. 11, 2010 (JP) ................................. 2010-133662

(51) Int. Cl.
*H01L 23/34* (2006.01)

(52) U.S. Cl.
USPC ........................................................ 257/714

(58) Field of Classification Search
USPC ........................................................ 257/714
See application file for complete search history.

(56) References Cited

U.S. PATENT DOCUMENTS

| 6,377,457 | B1 * | 4/2002 | Seshan et al. | 361/690 |
| 6,992,887 | B2 * | 1/2006 | Jairazbhoy et al. | 361/689 |
| 7,372,148 | B2 * | 5/2008 | Im et al. | 257/714 |

FOREIGN PATENT DOCUMENTS

| JP | 02-152261 | 6/1990 |
| JP | 6-284522 | 10/1994 |
| JP | 7-222458 | 8/1995 |
| JP | 7-240487 | 9/1995 |
| JP | 8-32248 | 2/1996 |
| JP | 10-51912 | 2/1998 |
| JP | 10-205830 | 8/1998 |
| JP | 10-229288 | 8/1998 |
| JP | 11-163235 A | 6/1999 |
| JP | 2002-228184 | 8/2002 |
| JP | 2002-314037 | 10/2002 |
| JP | 2009-295808 | 12/2009 |
| JP | 2010-73965 | 4/2010 |

OTHER PUBLICATIONS

Office Action issued Oct. 2, 2012 in Japanese Patent Application No. 2010-133662 with partial English language translation.
U.S. Appl. No. 13/113,380, filed May 23, 2011, Miyamoto.
U.S. Appl. No. 13/455,577, filed Apr. 25, 2012, Miyamoto, et al.
Japanese Office Action dated Jul. 30, 2013, with partial English translation.

* cited by examiner

*Primary Examiner* — Jenny L Wagner
(74) *Attorney, Agent, or Firm* — Oblon, Spivak, McClelland, Maier & Neustadt, L.L.P.

(57) ABSTRACT

A semiconductor device includes an enclosure of insulating material having an introduction portion and a discharge portion for an insulating refrigerant and also having an opening, filters mounted on the introduction portion and the discharge portion, respectively, so as to prevent conductive foreign matter from entering the enclosure, a power semiconductor element provided on the outside of the enclosure, a heat sink bonded to the power semiconductor element and extending through the opening and within the enclosure, and an insulator covering the portions of the power semiconductor element and the heat sink lying outside of the enclosure.

8 Claims, 1 Drawing Sheet

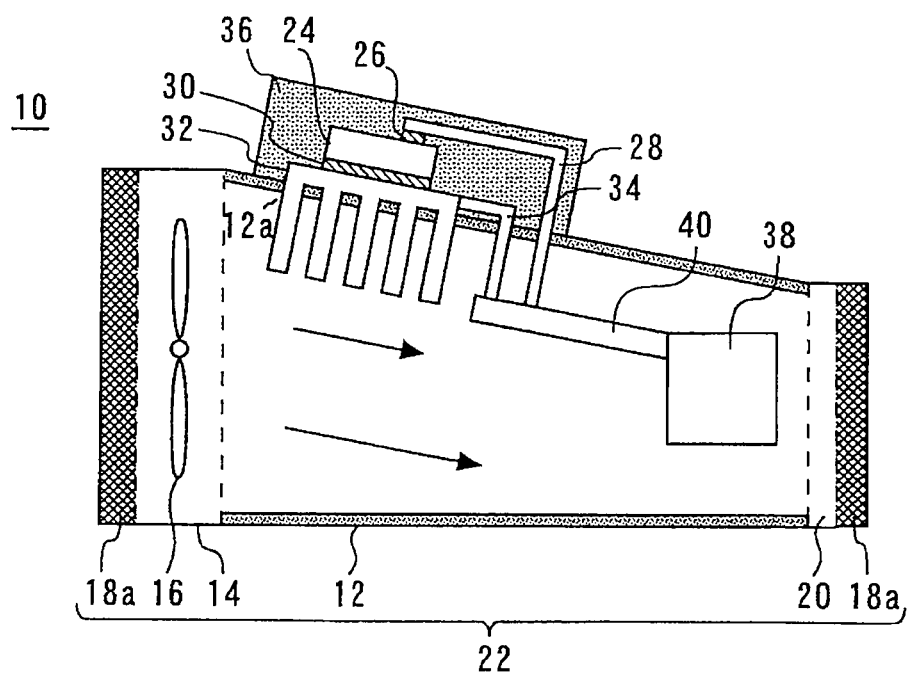

SEMICONDUCTOR DEVICE

BACKGROUND OF THE INVENTION

1. Field of the Invention

The present invention relates to a semiconductor device including a power semiconductor element.

2. Background Art

A power semiconductor element or device is a high voltage element used in power applications. The power semiconductor element must be insulated to maintain its electrical characteristics. Further, it is also necessary to enhance heat dissipation from the power semiconductor element in order to prevent degradation of the element due to high heat.

One way to enhance heat dissipation from a power semiconductor element while maintaining the insulation of the element is to mount it on a heat sink with an insulating plate therebetween (see, e.g., Japanese Laid-Open Patent Publication No. 2010-073965).

Thus it is common to mount a power semiconductor element on a heat sink with an insulating plate therebetween in order to increase heat dissipation from the power semiconductor element while maintaining the insulation of the element. It should be noted that insulating plates are made of low heat conductive material. It has been found, therefore, that the insulating plate between the power semiconductor element and the heat sink may prevent sufficient heat dissipation from the power semiconductor element.

SUMMARY OF THE INVENTION

The present invention has been made to solve this problem. It is, therefore, an object of the present invention to provide a semiconductor device containing a power semiconductor element and constructed to enhance heat dissipation from the power semiconductor element while maintaining the insulation of the element.

According to one aspect of the present invention, a semiconductor device includes an enclosure of insulating material having an introduction portion and a discharge portion for an insulating refrigerant and also having an opening, filters mounted on the introduction portion and the discharge portion, respectively, so as to prevent conductive foreign matter from entering the enclosure, a power semiconductor element provided on the outside of the enclosure, a heat sink bonded to the power semiconductor element and extending through the opening and within the enclosure, and an insulator covering the portions of the power semiconductor element and the heat sink lying outside of the enclosure.

Other and further objects, features and advantages of the invention will appear more fully from the following description.

BRIEF DESCRIPTION OF THE DRAWING

FIG. 1 is a cross-sectional view of a semiconductor device in accordance with an embodiment of the present invention.

DETAILED DESCRIPTION OF THE PREFERRED EMBODIMENT

Embodiment

FIG. 1 is a cross-sectional view of a semiconductor device 10 in accordance with an embodiment of the present invention. The semiconductor device 10 includes an enclosure 12 which is made of insulating material. This enclosure 12 is constructed so that insulating refrigerant (namely, air) can be passed therethrough. The enclosure 12 is provided with an insulating refrigerant introduction portion 14. The introduction portion 14 has a plurality of openings. A fan 16 is mounted on the upstream side of these openings to forcibly introduce an insulating refrigerant into the enclosure 12. Further, a filter 18a is mounted on the upstream side of the fan 16. The filter 18a serves to prevent conductive foreign matter from entering the enclosure 12.

The enclosure 12 is also provided with a discharge portion 20 to discharge the introduced insulating refrigerant from the enclosure 12. The discharge portion 20 has a plurality of openings. A filter 18b is mounted on the downstream side of these openings. The filter 18b serves to prevent conductive foreign matter from entering the enclosure 12. Thus, the introduction portion 14 is formed on one side of the enclosure 12, and the discharge portion 20 is formed on the opposite side of the enclosure 12. The enclosure 12 also has a plurality of openings 12a. These openings 12a are formed in a side of the enclosure 12. The enclosure 12, the introduction portion 14, the fan 16, the filter 18a, the discharge portion 20, and the filter 18b described above together form a unit which may be hereinafter referred to as the cooling unit 22.

The semiconductor device 10 includes an IGBT 24. The IGBT 24 has a gate and an emitter on its top surface and a collector on its bottom surface. An electrode 28 is bonded to the emitter on the top surface of the IGBT 24 by solder 26. A heat sink 32 is bonded to the collector on the bottom surface of the IGBT 24 by solder 30. An electrode 34 is bonded to the heat sink 32. Portions of the electrodes 28 and 34 and the heat sink 32 extend through the openings 12a and within the enclosure 12.

An insulator 36 covers the IGBT 24 and the solders 26 and 30 and also covers the portions of the heat sink 32 and the electrodes 28 and 34 lying outside of the enclosure 12. That is, the components disposed on the outside of the cooling unit 22 are insulated from the ambient atmosphere by the insulator 36.

The enclosure 12 contains a reactor 38. The reactor 38 is an accessory for use with the IGBT 24. The reactor 38 is connected to the electrodes 28 and 34 through a bus bar 40. The bus bar 40 is disposed in and exposed to the atmosphere within the enclosure 12.

In the semiconductor device 10 of the present embodiment, the insulator 36 covers the IGBT 24 and the solders 26 and 30 and also covers the portions of the heat sink 32 and the electrodes 28 and 34 lying outside of the enclosure 12. Further, the portions of the electrodes 28 and 34 and the heat sink 32 extending through the openings 12a and within the enclosure 12 are enclosed and isolated from the ambient environment by the enclosure 12 and the filters 18a and 18b. This construction of the semiconductor device 10 of the present embodiment ensures that the IGBT 24 is insulated from the ambient environment.

Further, the construction of the semiconductor device 10 of the present embodiment enhances heat dissipation from the IGBT 24. Specifically, in this construction, an insulating plate is not interposed between the heat sink 32 and the IGBT 24, and the heat sink 32 is directly bonded to the IGBT 24 by solder. Therefore, the heat transfer coefficient between the bottom surface of the IGBT 24 and the heat sink 32 is high, resulting in improved heat dissipation from the IGBT 24. Thus the semiconductor device 10 of the present embodiment is constructed to enhance heat dissipation from the IGBT 24 while maintaining the insulation of the IGBT 24.

Further, the bus bar 40 and the reactor 38 are disposed within the enclosure 12 and isolated from the ambient environment by the enclosure 12 and the filters 18a and 18b. This eliminates the need to insulate these components when they are installed within the enclosure 12, resulting in increased heat dissipation from them. Further, insulating refrigerant may be forcibly introduced into the enclosure 12 by the fan 16 to further cool the inside of the enclosure 12. Therefore, there is no need for a large scale cooling system such as a water cooling system, which consumes more energy than this cooling system.

In the semiconductor device 10 of the present embodiment, the reactor 38 is disposed within the enclosure 12, which construction enables reduction of the size of the device. Further, the connection of the IGBT 24 to the reactor 38 is made by means of the bus bar 40 within the enclosure 12. This allows reduction of the wiring length between the IGBT 24 and the reactor 38 so that the IGBT 24 is subjected to less inductive noise, thus increasing the noise tolerance of the semiconductor device 10.

Further, in the semiconductor device 10 of the present embodiment, the heat sink 32, from which heat must be readily removed, is disposed on the introduction portion 14 side of the device, while the reactor 38 is disposed on the discharge portion 20 side of the device, thus cooling preferentially the heat sink 32.

The present invention is not limited to the construction described above. For example, the IGBT 24 may be replaced by any other suitable power semiconductor element such as a freewheeling diode. The reactor 38 may be replaced by any other suitable accessory such as a rectifier capacitor. The bus bar 40 may be replaced by a different type of conductor. Further, the insulating refrigerant used may be chlorofluorocarbon refrigerant or other type of insulating refrigerant, instead of air. Further, the heat discharged from the discharge portion 20 may be utilized by a heat exchange system.

In accordance with the present invention it is possible to enhance heat dissipation from a power semiconductor element while maintaining the insulation of the element.

Obviously many modifications and variations of the present invention are possible in the light of the above teachings. It is therefore to be understood that within the scope of the appended claims the invention may be practiced otherwise than as specifically described.

The entire disclosure of a Japanese Patent Application No. 2010-133662, filed on Jun. 11, 2010 including specification, claims, drawings and summary, on which the Convention priority of the present application is based, are incorporated herein by reference in its entirety.

What is claimed is:

1. A semiconductor device comprising:
   an enclosure of insulating material having an introduction portion and a discharge portion for an insulating refrigerant and also having an opening;
   filters mounted on said introduction portion and said discharge portion, respectively, so as to prevent conductive foreign matter from entering said enclosure;
   a power semiconductor element provided on the outside of said enclosure;
   a heat sink bonded to said power semiconductor element and extending through said opening and within said enclosure;
   an insulator covering the portions of said power semiconductor element and said heat sink lying outside of said enclosure; and
   an electrode bonded to said power semiconductor element and extending into said enclosure.

2. The semiconductor device according to claim 1, wherein the insulating refrigerant is gaseous and a fan is disposed in said introduction portion to introduce said gaseous insulating refrigerant into said enclosure.

3. The semiconductor device according to claim 1, further comprising:
   an accessory for said power semiconductor element and disposed within said enclosure; and
   a conductor disposed within said enclosure and connected between said electrode and said accessory;
   wherein said insulator covers the portion of said electrode lying outside of said enclosure.

4. The semiconductor device according to claim 3, wherein said heat sink is disposed at the same side of said semiconductor device as said introduction portion, and said accessory is disposed at the same side of said semiconductor device as said discharge portion.

5. The semiconductor device according to claim 2, wherein the gaseous insulating refrigerant is air.

6. A semiconductor device comprising:
   an enclosure of insulating material having an introduction portion and a discharge portion for an insulating refrigerant and also having an opening;
   filters mounted on said introduction portion and said discharge portion, respectively, so as to prevent conductive foreign matter from entering said enclosure;
   a power semiconductor element provided on the outside of said enclosure;
   a heat sink bonded to said power semiconductor element and extending through said opening and within said enclosure;
   an insulator covering the portions of said power semiconductor element and said heat sink lying outside of said enclosure;
   an electrode bonded to said power semiconductor element and extending into said enclosure;
   an accessory for said power semiconductor element and disposed within said enclosure; and
   a conductor disposed within said enclosure and connected between said electrode and said accessory,
   wherein said insulator covers the portion of said electrode lying outside of said enclosure.

7. The semiconductor device according to claim 1, wherein the electrode is bonded to a top surface of said power semiconductor element.

8. The semiconductor device according to claim 7, further comprising:
   a second electrode bonded to said heat sink and extending into said enclosure.

* * * * *